United States Patent [19]

Goudonnet et al.

[11] Patent Number: 5,306,918

[45] Date of Patent: Apr. 26, 1994

[54] INSTALLATION FOR THE STUDY OR THE TRANSFORMATION OF THE SURFACE OF SAMPLES PLACED IN A VACUUM OR IN A CONTROLLED ATMOSPHERE

[76] Inventors: Jean-Pierre Goudonnet, 12F rue Isabelle du Portugal, 21000 Dijon; Yvon LaCroute, 13 rue Champs Fleuris, 21850 Saint-Apollinaire, both of France

[21] Appl. No.: 946,412
[22] PCT Filed: May 7, 1991
[86] PCT No.: PCT/FR91/00378
  § 371 Date: Jan. 5, 1993
  § 102(e) Date: Jan. 5, 1993
[87] PCT Pub. No.: WO91/17429
  PCT Pub. Date: Nov. 14, 1991

[30] Foreign Application Priority Data

May 10, 1990 [FR] France .................. 90 05823

[51] Int. Cl.$^5$ ............................. H01J 37/26
[52] U.S. Cl. .................. 250/442.11; 250/306
[58] Field of Search ............ 250/442.11, 441.11, 250/440.11, 306, 307

[56] References Cited

U.S. PATENT DOCUMENTS

| | | |
|---|---|---|
| 4,908,519 | 3/1990 | Park et al. .............. 250/306 |
| 4,992,660 | 2/1991 | Kobayashi ............. 250/442.11 |
| 5,061,850 | 10/1991 | Kelly et al. ............ 250/306 |
| 5,095,680 | 10/1991 | Kesmodel et al. ....... 250/442.11 |
| 5,157,256 | 10/1992 | Aaron .................. 250/306 |
| 5,200,616 | 4/1993 | Kokawa et al. ......... 250/441.11 |

OTHER PUBLICATIONS

K. Sugihara et al., *Review of Scientific Instruments*, vol. 61, No. 1, Jan. 1990, (New York, US), "An ultrahigh vacuum tip transfer system for the scanning tunneling microscopy/field ion microscopy", pp. 81–85.

G. E. Poirier et al., *Reivew of Scientific Instruments*, vol. 60, No. 10, Oct. 1989, (New York, US), "A new ultra-high vacuum scanning tunneling microscope design for surface science studies", pp. 3113–3118.

International Search Report and Annex.
International Preliminary Examination Report.

*Primary Examiner*—Bruce C. Anderson
*Attorney, Agent, or Firm*—Sandler, Greenblum & Bernstein

[57] ABSTRACT

Installation for the analysis or transformation of the surface of samples placed in a vacuum or controlled atmosphere, including a main enclosure in which is positioned a support plate for at least one device, called SXM, in which a microprobe such as a light or electricity conducting tip is positioned close to the surface of the sample to be examined, whether in the air or in a vacuum. The device is intended for the microscopy, spectroscopy or etching of the sample surface by scanning of the surface by the microprobe. The support plate is equipped with elements for disconnecting it from the main enclosure and with elements for rotating the support plate around a central axis allowing the use of a series of SXM devices fitted into the periphery of the support plate. The main enclosure is completed by a scrubbing enclosure for the surface of the samples and by an introduction and storage enclosure for the samples, which can be handled through the installation by the end of a conveyor rod that can be moved longitudinally and in axial rotation along the alignment axis of the enclosures.

18 Claims, 6 Drawing Sheets

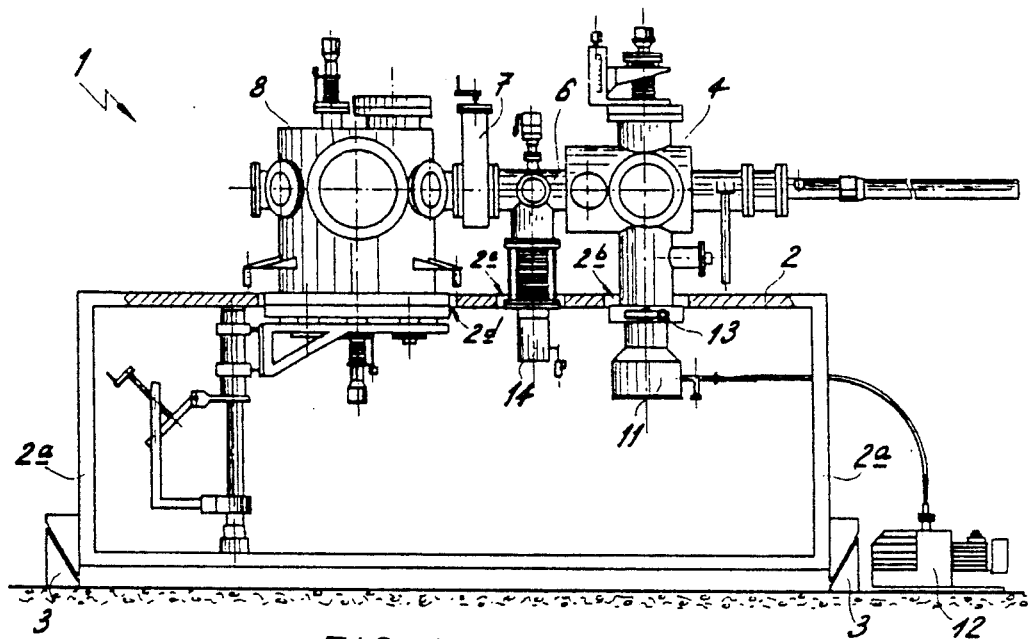
FIG. 1
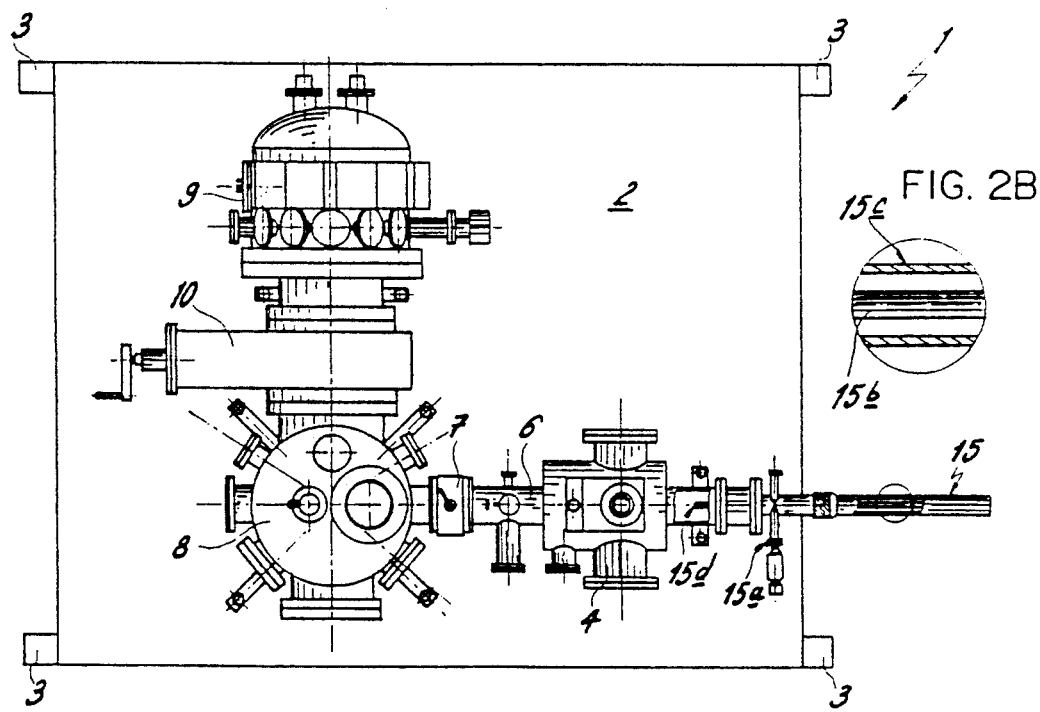
FIG. 2A
FIG. 2B

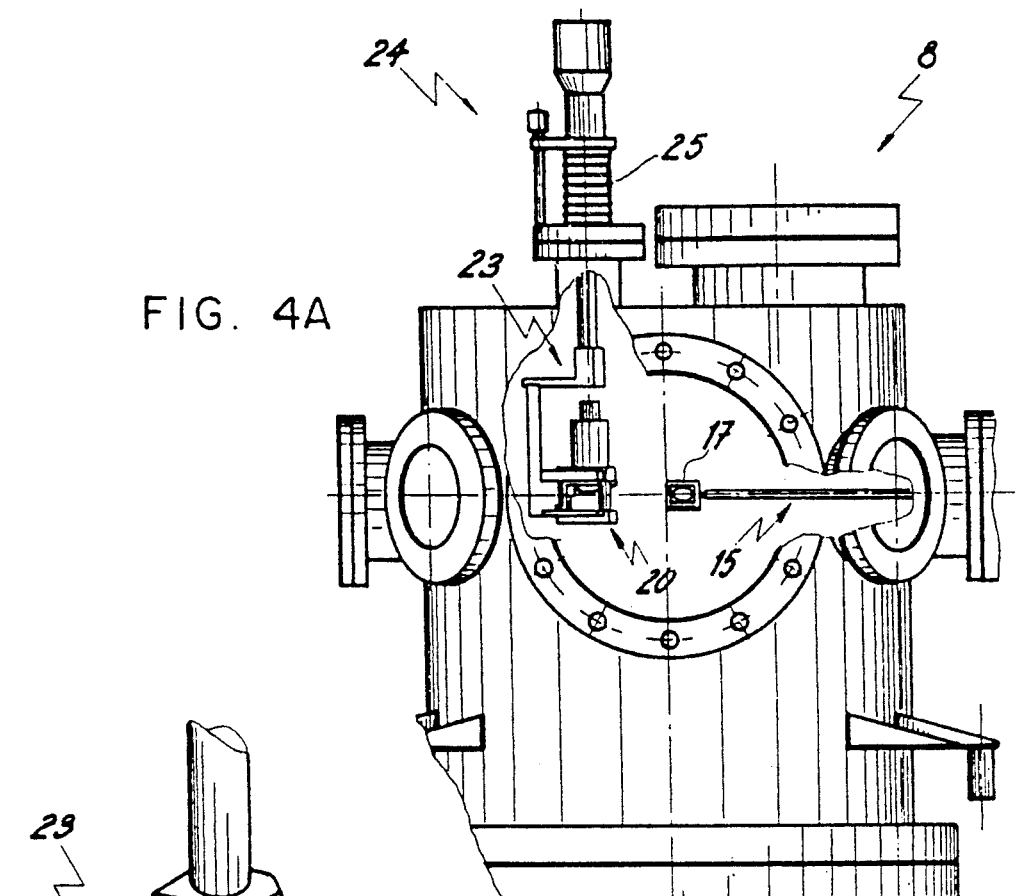
FIG. 4A
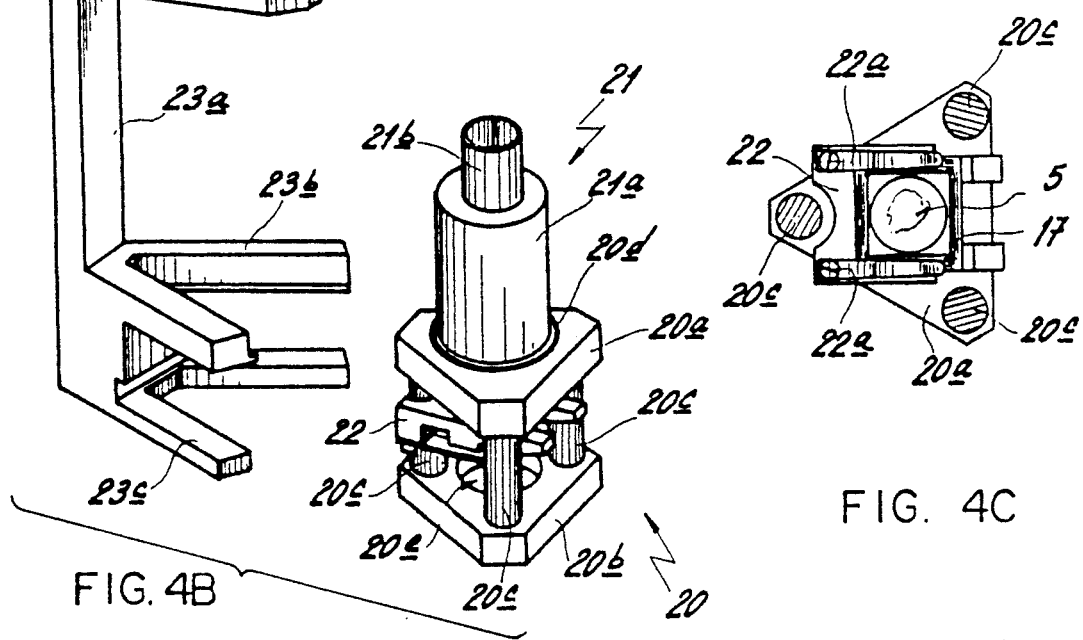
FIG. 4B
FIG. 4C

INSTALLATION FOR THE STUDY OR THE TRANSFORMATION OF THE SURFACE OF SAMPLES PLACED IN A VACUUM OR IN A CONTROLLED ATMOSPHERE

BACKGROUND OF THE INVENTION

1. Field of the Invention

This invention relates to an installation for the study of the surface of samples placed in a vacuum or controlled atmosphere. It applies in particular to electronic tunneling effect microscopy and/or spectroscopy, namely in ultravacuum, to optic tunneling effect microscopy and/or spectroscopy or further to the etching of nanometric structures through optic and/or electronic microlithographical processes.

2. Discussion of Background Information

It is a well known fact that certain microscopy, spectroscopy or microlithography processes can only be conducted in a particularly clean, controlled atmosphere especially in order not to pollute the surface of the samples being studied, or the samples on which tiny structures are to be realized, such as optic or electronic integrated circuits. In this respect, the vacuum is a particularly useful controlled medium and some applications even require the samples and measuring or etching means to be placed in an ultravacuum, i.e., in a high vacuum. In this sense, a series of microscopy or spectroscopy techniques have been developed employing a lateral scanning of the surface of a sample by an electricity or light conducting tip, this tip being an integral part of a microprobe collecting, by tunneling effect, electrons or photons in numbers that largely depend on an exponential function of the distance separating the tip from the surface; it is common usage to call electronic tunneling microscopy, or STM (Scanning Tunneling Microscopy), the technique using electrons, and optic tunneling microscopy, or PSTM (Photon Scanning Tunneling Microscopy) the technique using photons. As a general rule, these two techniques and equivalent techniques, i.e., those in which a microprobe should be positioned close to the surface of a sample to be studied, either in the air or in a vacuum will be collectively referred to as SXM. Moreover, these initials will be used to refer to microscopes or means of study using these techniques. Finally, it should be noted that SXMs all operate in the same way as a roughometer, and that this expression will be generally used without distinguishing the physical principle applied during measurement.

In all cases, the distances to be maintained between the surface and the microprobe or tip are extremely small, i.e., 1–2 nanometers for the STM and approximately one micrometer for the PSTM. Such small values mean that risks of error in manipulation should be reduced to a minimum and therefore require the use of highly reliable mechanical, electronic or optical components. Without such highly reliable components destructive impacts car more or less, occur between the microprobe and the surface of the sample to be studied or etched, these impacts being caused by the loss of control of the spatial position of the tip. Another cause of damage results from too quick a scanning of the surface with regard to the response time of the components or mechanical and/or electronic circuits controlling the distance between the tip and the surface. Moreover scanning speed is an obvious function of the roughness of the surface. This means that a smooth surface can be scanned quicker than a rough surface, but it is never easy to know exactly before the study. In the case of an impact caused for some reason, the microprobe or the tip must be changed frequently, or at least controlled, which is not always possible directly in an enclosure where a vacuum has been made or where a controlled atmosphere is concerned. In addition, the aging of the tips, especially metal tips in the case of STM, or optic tips in the case of PSTM, is a normal phenomenon requiring their replacement. For example, an STM tip might have to be replaced due to a rearrangement of the terminal atoms of the tip or due to capturing a foreign atom or due to a thermal expansion effect. A final case, also very important, for which it is essential to change the microprobe or tips in order to study the surface of a sample is that where the measurements taken with a first microprobe are uncertain or at least surprising enough to have to be confirmed by a second series of measurements. In particular, it is a well known fact that STM only gives an exploitable topographic image of the surface of a sample if the metal tip has a theoretical profile whose effects on the formation of the image are well established, i.e., vis-a-vis the intensity of the tunnel current being set up between the surface and the tip (the exploitation of a "rough" image thus consists in the deconvolution of the image, in the mathematical sense of the term). Because this condition is not always realized, it might be useful to establish successive cartographs of the same surface, using various tips, the ideal being that these tips are available "in situ" so as to avoid any risk of contaminating the surface under examination by placing the sample in a normal, uncontrolled atmosphere, or simply, due to the delay between successive scannings. Indeed, we know that a scrubbed surface placed in a vacuum becomes covered with a coat of oxides or oxygen within about 1 hour after its scrubbing, even if the vacuum is an ultravacuum, i.e., the surface is contained within an enclosure where the pressure is lower than $10^{-9}$ torr.

Few installations are known that are adapted to the study or etching of the surface of samples placed in vacuum by SXM type techniques offering the possibility of quickly changing the microprobe or the tip used for carrying out this study or etching without having to "interrupt" the vacuum to come back to atmospheric pressure, without dismantling the enclosure to reach the microprobe, or without interrupting the study of the sample for an excessive lapse of time. In this respect, an electric tunneling effect microscope developed by the British company W.A. Technology Limited is equipped with a device allowing the replacement of the tip used for measuring, without having to open the ultravacuum enclosure; the mechanisms used for this purpose are however complex and only allow the tip to be replaced. However, damage can also be done to the microscope itself, or part of it, which will still make it necessary for the ultravacuum enclosure to be opened.

Moreover, it is known that the introduction of a sample in an enclosure in controlled atmosphere or an enclosure in vacuum or ultravacuum is not at all easy. In particular, it is essential to preserve as far as possible the tightness and the cleanliness of the enclosures where the microprobe or the tip used for measuring or etching is located which requires a particularly careful study if samples are to be introduced into the study or etching enclosure without risk of "breaking" the vacuum or contaminating the surrounding atmosphere. This problem has not yet been solved with the existing prototypes, or it has been solved, but in a very complex way, which limits the industrial applications of the SXM installations, and, in particular, that of tunnel microscopes operating in controlled atmosphere or in the ultravacuum.

SUMMARY OF THE INVENTION

The object of this invention is to find a solution to all these drawbacks in proposing an installation for the study of the sample surface placed under vacuum or in a controlled atmosphere, of the type including a main enclosure in which is placed a support plate for at least one device, named SXM, intended for the microscopy, spectroscopy or etching of the surface of samples, according to a process using a scanning of the surface by means of an electricity or light conducting tip, the installation being characterized in that the support plate can be disconnected from the main enclosure and rotated on itself around a central axis to allow the use of a series of SXM devices fitted into the periphery of the plate.

Preferably, the tip will be an integral part of a microprobe collecting, by an effect called tunneling, electrons or photons in a number that depends on an exponential function of the distance separating the tip from the surface of the sample.

In a preferred form of execution of the invention, the support plate can be of a generally circular form for example, the peripheral SXM devices being placed in adjacent angular sectors. Moreover, it is obvious that the number of such devices it is possible to install on the plate depends directly on their size and on the diameter of the plate and is normally only limited by the weight of the unit and the space occupied within the main enclosure. In this respect, the volume of the main enclosure should not be too large if a high vacuum is to be obtained with reasonable means, or if a controlled atmosphere is to be maintained within it (Class I clean enclosure, for example).

The rotation of the plate completely eliminates all the previously mentioned drawbacks in current installations, simply because it makes it easy to replace:

either a tip or a microprobe used for the analysis or the etching by another tip or another microprobe;

or at least part of an SXM device by another one situated on the same plate, this other device originally being inside the main enclosure.

In this way, we cover all the interventions required in the case of damage affecting such devices, or useful for checking the measurements obtained on a sample, these interventions consisting in a simple permutation between several SXM devices or between several microprobes (such as light or electricity conducting tips), permutation obtained directly by the disconnection and the rotation of the support plate.

According to a complementary and important characteristic of this invention, an enclosure for etching the surface of the samples and an enclosure for the introduction and storage of the samples completes the main enclosure. After placing the samples in the introduction and storage enclosure, they are picked up by the end of a conveyor rod to be transferred to the scrubbing enclosure where the surface to be examined or etched is scrubbed, if needed, then, after opening a valve separating the scrubbing enclosure from the main enclosure, transferred towards a support system that can be manipulated in rotation and in vertical and/or lateral translation by means of a suitable handling means. Once the sample is in place on its support system, the handling means combines with one of the peripheral SXM devices of the plate placed within the main enclosure, so as to deposit the sample above the tip or microprobe equipping the device.

The introduction and storage enclosure of the samples and the scrubbing enclosure thus act as an air-lock that can be brought back to atmospheric pressure to introduce the samples, then placed under vacuum at a pressure allowing the opening of the valve separating the enclosures from the main enclosure where a first vacuum has been made, or in which the atmosphere is controlled. In accordance with the invention, the length of time the valve is open corresponds just to that necessary for the retrieval or the setting up of a sample on the support system manipulatively located inside the main enclosure. During the recovery of a sample, the conveyor rod deposits the sample within the storage enclosure on a suitable support system, which might take some time, but it is obvious that the valve can be closed again as soon as the conveyor rod has been removed upstream from the valve. In the opposite working, the conveyor rod picks up a sample inside the storage enclosure and, following the opening of the valve, transfers it onto the support system manipulatable inside the main enclosure. The combination of the conveyor rod according to a mainly axial movement and the manipulatable support system that can be moved in rotation and vertical and/or lateral translation makes it possible to study or etch a successive variety of samples placed in waiting in the storage enclosure, the SXM device being perfectly safe in the main enclosure from being brought back to atmospheric pressure or from an external contamination.

BRIEF DESCRIPTION OF THE DRAWINGS

Other characteristics and advantages of this invention are detailed in the description hereunder of a type of execution of an installation mainly intended for electronic tunneling effect microscopy, or STM, in ultravacuum given as a non-limitative example in reference to the attached drawings, in which:

FIG. 1 shows a front view of an installation in accordance with the invention.

FIG. 2a shows an overhead view of the installation illustrated in FIG. 1,

FIG. 2b shows an enlarged section of the conveyor rod illustrated in FIG. 2a,

FIG. 4a shows a partially exploded view of the main enclosure, illustrating namely the manipulatable sample support, mounted on a handling arm and working with the end of the conveyor rod carrying the sample support frame, FIG. 4b is a perspective view of the handling arm and the sample support system, FIG. 4c is an underside view of the support system shown in FIG. 4b, the bottom plane of which has been withdrawn in order to show the sample support plate, FIG. 5a shows a perspective view of a circular support plate upon which are mounted six electronic tunneling effect microscopes, whilst a handling arm is placing the manipulatable sample support system on one of the microscopes, the support plate being equipped with its anti-vibration device and suspended in the main enclosure by means of a double peripheral spring system, FIG. 5b an enlarged view of the cylindrical piezoelectric tube illustrated in FIG. 5a, FIG. 6 is an exploded perspective view showing the assembly of the anti-vibration device of the support plate shown in FIG. 5a;

DETAILED DESCRIPTION OF THE PREFERRED EMBODIMENTS

Figure 3A:
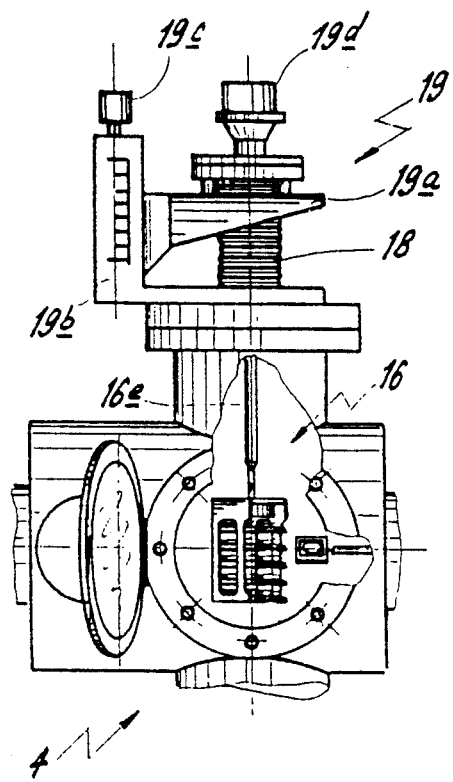
FIG. 3a shows a partially exploded view of the enclosure for the introduction and storage of the samples, illustrating namely the sample storage device and the end of the conveyor rod onto which is screwed the sample support frame.

First of all, the principle of STM microscopy should be evoked. Electronic tunneling effect microscopy consists in placing an extremely fine metal tip close to a conducting surface, polarized with regard to the tip. If the distance between the tip and the surface is small enough, electrons, through a tunneling effect, can cross the potential barrier due to the polarization and a tunneling electron current can then be established, the intensity of which varies in accordance with an exponential law, depending on the distance. Thanks to an electronic control system, this distance is adjusted so as to maintain a constant intensity tunneling current, fixed as reference in the control loop of the feedback system. A surface scanning device, perpendicular to the feedback direction of the distance between the tip and the surface, enables its topography to be taken by recording the variations in the position of the tip. In another variant of this type of microscopy, the tip is maintained at a constant distance and the tunneling current intensity variation is then recorded to extract the topography of the surface directly. The strong dependance of the tunneling current intensity in relation to the distance, the use of a high bandwidth electronic feedback system and the use of piezoelectric ceramics for the respective vertical and horizontal movements of the tip and surface to be analyzed, enable the obtaining of topographic images with a resolution equal to angstrom fractions (e.g., 0.05 A) perpendicular to this surface and to 0.1 angstrom parallel to it. This resolution is all the better when the analysis of the surface, usually very polluted in the air, is carried out in a controlled atmosphere, and, in fact, the best images are obtained when the tip and the surface are placed within an enclosure where a high vacuum has been made.

According to this invention and in accordance with FIGS. 1 and 2a and 2b attached, an installation 1 for the electronic tunneling microscopy in ultravacuum includes first of all a horizontal table 2 equipped with vertical legs 2a bearing on the ground by means of four anti-vibration pneumatic supports 3 to isolate the table 2 from the vibrations within the building where the installation 1 is set up. The height of these vertical legs 2a makes it easy to reach under the table 2 to set up the elements required for operating the installation 1. In addition, in accordance with this invention, the installation 1 is mainly composed of an enclosure for the introduction and storage 4 of the samples 5 (FIG. 3c) to be analyzed, in the prolongation of which there is an ionic scrubbing enclosure 6 for the samples 5, then a valve 7 of the gate type for example, opening vertically upwards, for example, and finally a main enclosure 8 in which the microscopy of the samples 5 is carried out.

Within the main enclosure 8 there is a high vacuum, or ultravacuum, i.e., a pressure of approximately $10^{-10}$ torr, favorable for obtaining topographic images of the sample surface 5 by electronic tunneling microscopy. This pressure is obtained in a conventional way, thanks to an ionic pump 9 (FIG. 2a) connected to the side of the main enclosure 8. This enclosure can, however, be isolated from the ionic pump 9 by means of a second valve 10 (FIG. 2a), of the gate type opening for example horizontally.

Within the introduction and storage enclosure 4 and within the ionic scrubbing enclosure 6 of the sample 5, there is a vacuum lower than that within the main enclosure 8, but not, however, a low vacuum; in this respect, the introduction and storage enclosure 4 is connected in its lower part to a turbomolecular pump 11 (FIG. 1) sufficient for establishing a pressure of approximately $10^{-6}$ within the two enclosures (4, 6). This pump 11 is placed in series with a vane pump charged with establishing a low vacuum within the enclosures (4, 6, 8) before starting the pumps 9 and 11. A horizontal valve 13, also of the gate type, separates the base of the introduction and storage enclosure 4 from the turbomolecular pump 11.

Under working conditions, i.e., when the various vacuums have been established within the enclosures (4, 6, 8), the valves (7, 10, 13) are normally closed so as not to perturb the measurements carried out on the sample 5 during analysis. Also, the ionic pump 9 and the turbomolecular pump 11 have the advantage of being able to be stopped easily, as soon as the valves 7 and 13 are closed. Consequently, it is obvious that the ionic pump 9 could be replaced by a pump of equivalent performance such as a turbomolecular pump or a cryopump. If necessary, it is also possible to equip the main enclosure 8 with several pumps 9 to take into account the interior volume of the enclosure 8 which, as will be described later, would enable the autonomy of the installation 1 to be increased. These alterations are usually within the capabilities of a man of the trade and enter fully into the scope of this invention.

As it can be seen in FIG. 1, the enclosures (4, 6, 8) rest on the horizontal table 2 and share a same horizontal plane situated slightly above the table 2. Openings 2b, 2c and 2d are also made in the table 2, either for the passage of certain parts of the enclosures (4, 6, 8), or for their clearance through the bottom. In this respect, an ionic gun 14 (FIG. 1) equips the lower part of the ionic scrubbing enclosure 6, and, if necessary, delivers a current of ions in the direction of the surface of a sample 5 to be analyzed. This scrubbing of the samples 5 during their passage in the enclosure 6 is not compulsory as it is a destructive method altering the surface of the materials treated, even if it is otherwise known that this scrubbing only reaches the first atomic layers of the surface.

In accordance with a particularly advantageous characteristic of the invention, the installation 1 also includes a conveyor rod 15 (FIGS. 2a and 2b) located in the medium horizontal plane of the enclosures (4, 6, 8) and which can be moved longitudinally and in axial rotation according to the alignment axis of the enclosures (4, 6, 8) to ensure the reciprocal transfers of a sample 5 between the introduction and storage enclosure 4 and the main enclosure 8, after opening the valve 7. The longitudinal movements of the conveyor rod 15 are obtained through a rack and pinion device 15a, while the conveyor rod 15 is also composed of a shaft 15b with journals in a coaxial sleeve 15c that provides its axial rotation as illustrated in FIG. 2B.

Figure 3B:
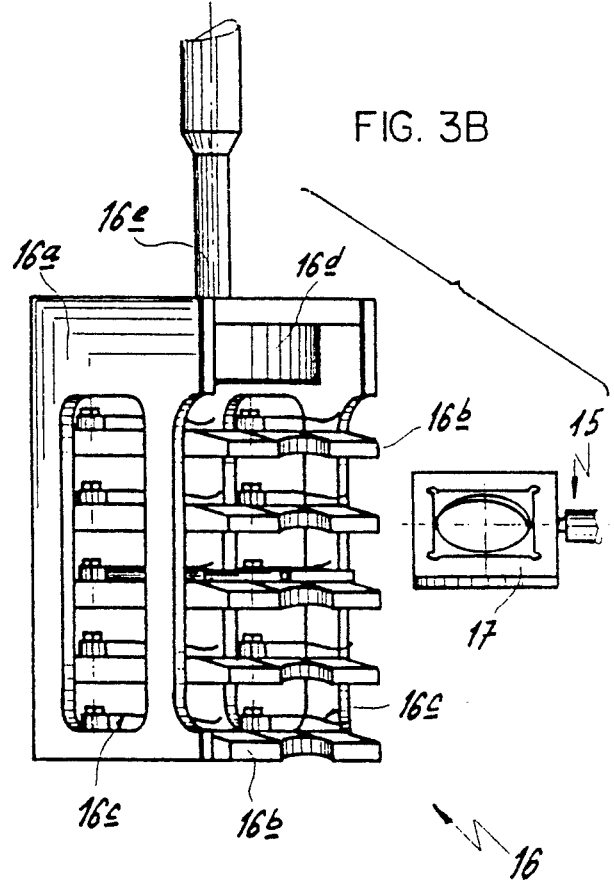
FIG. 3b is a close-up view of the sample storage device shown in FIG. 3a, FIG. 3c shows an exploded view in perspective of the sample support frame assembly.
Figure 3C:
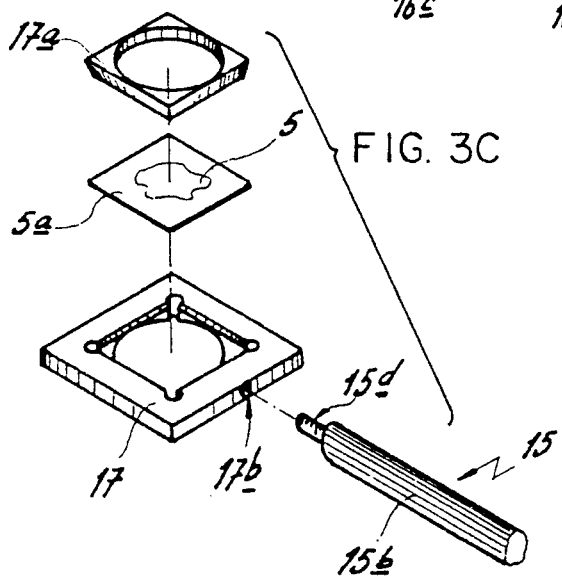

In accordance with FIG. 3c, the samples 5 are mounted on a support frame 17 in which they are held by a counter frame 17a, while a threaded hole 17b is provided on the side of the frame 17 so that it is possible to screw in the end 15d of the shaft 15b of the conveyor rod 15. As a general rule, the samples 5 are conductors of electricity and are available in the dimensions of the counter-frame 17a, which enables them to be held on the frame 17 without any difficulty. In the case of biological samples 5, plaquettes 5a of conducting graphite are used on which it is easy to make a biological sample 5 immersed in a solvent adhere by capillarity; the dimensions of the plaquettes 5a to be used are of course in proportion with the dimensions of the frame 17 and counter-frame 17a.

In compliance with FIG. 3a, which shows a partially exploded view of the introduction and storage enclosure 4 of the samples 5, the end 15d of the shaft 15b of the conveyor rod 15 (FIG. 3c) works with a storage device 16 of the samples 5 to be analyzed. In accordance with a preferred variant of this invention, described in reference to FIG. 3b, the device 16 appears in the form of a rack 16a divided into compartments to receive the support frames 17 of the samples 5. For this purpose, the support frames 17 are placed on then be transferred to the ionic scrubbing enclosure 6 or to the main enclosure 8 after the gate valve 7 has opened. Possibly, the shaft 15b of the conveyor rod 15 can be rotated on itself, which allows the possibility of choosing the side of the sample 5 to be analyzed by STM microscopy. In this way, it is also possible to store the samples 5 in the storage device 16 with their side to be studied placed on the top whilst, according to the preferred execution of the installation 1, such as shown in FIG. 1, the ionic gun 14 delivers an ionic current, of argon ions, for example, on the lower side of the sample 5 presented to it. As will be discussed later, this arrangement of the installation 1 gives certain advantages as to the ergonomics of the STM devices placed within the main enclosure 8.

After its transfer to the main enclosure 8, a sample 5 is recovered by a support system 20 in a way described in reference to FIGS. 4a, 4b and 4c. According to FIGS. 4a and 4b, the support system 20 is equipped with a means of vertical displacement, such as a piezoelectric motor 21, capable of moving in a vertical direction an almost horizontal microplate 22 adapted to receive the support frame 17 of the sample 5. The support system 20 is itself supported by a handling arm 23 which is controlled by a coaxial translation conventional rotation device 24 crossing the upper wall of the main enclosure 8 at the level of a flexible metal coupling 25 of the bellows type.

According to FIGS. 4b and 4c, the support system 20 presents two superimposed planes 20a and 20b, preferably triangular shaped, joined together by three vertical columns 20c, each placed between a top of the upper triangular plane 20a and a top of the lower triangular plane 20b. These two planes 20a and 20b present, respectively, a circular hole 20d and a circular hole 20e, the upper circular hole 20d being made to receive the piezoelectric motor 21. The piezoelectric motor 21 includes an external cylinder 21a inside which can be displaced an internal cylinder 21b bearing by its base the micro-plate 22, which in its turn holds the support frame 17 of a sample 5 fitted into a set of spring leaves 22a. It should be noted that the motor 21 offers a vertical excursion stroke that can reach 10 millimeters with a resolution equal to 1 nanometer, which enables a very fine vertical displacement of the sample 5.

In addition, according to FIG. 4b, the handling arm 23 presents a form corresponding to the gripping of the support system 20, i.e., it includes a vertical rod 23a supporting in its lower part two superimposed supports 23b and 23c tapering into a V shape open at the opposite end of the rod 23a, each coming to match two adjacent edges of the upper 20a and lower 20b triangular planes of the support system 20.

After fitting the support frame 17 of a sample 5 between the set of spring leaves 22a and the microplate 22 equipping the support system 20, the end 15d of the shaft 15b of the conveyor rod 15 is unscrewed and withdrawn on this side of the gate valve 7 which is then closed again. The sample 5 is thus "suspended" in the support system 20, at the end of the handling arm 23 (FIG. 4a). After the closing of the valve 7, the pressure in the main enclosure 8 which has risen to the level of the pressure in the storage enclosure 4 and scrubbing enclosure 6, due to making the two parts of the installation 1 correspond, gradually returns to its original level thanks to the action of the vacuum pump 9 that is attached to it.

By acting on the coaxial translation rotation device 24, the support system 20 is then dismounted above a device 26 intended for STM microscopy and resting, in the main enclosure 8, on a support plate 27 which will be described in reference to FIGS. 5a and 5b. In accordance with this figure, the support plate 27 is of a circular shape and includes six peripheral devices 26 placed in 6 adjacent angular sectors with an opening of 60°. This number is not limitative, but results from the choice of a maximum space required by the plate 27 in the main enclosure 8. It is understood that more or less than six devices 26 could be placed on the periphery of the support plate 27 in as many adjacent angular sectors as there would be such devices 26.

Figure 5A:
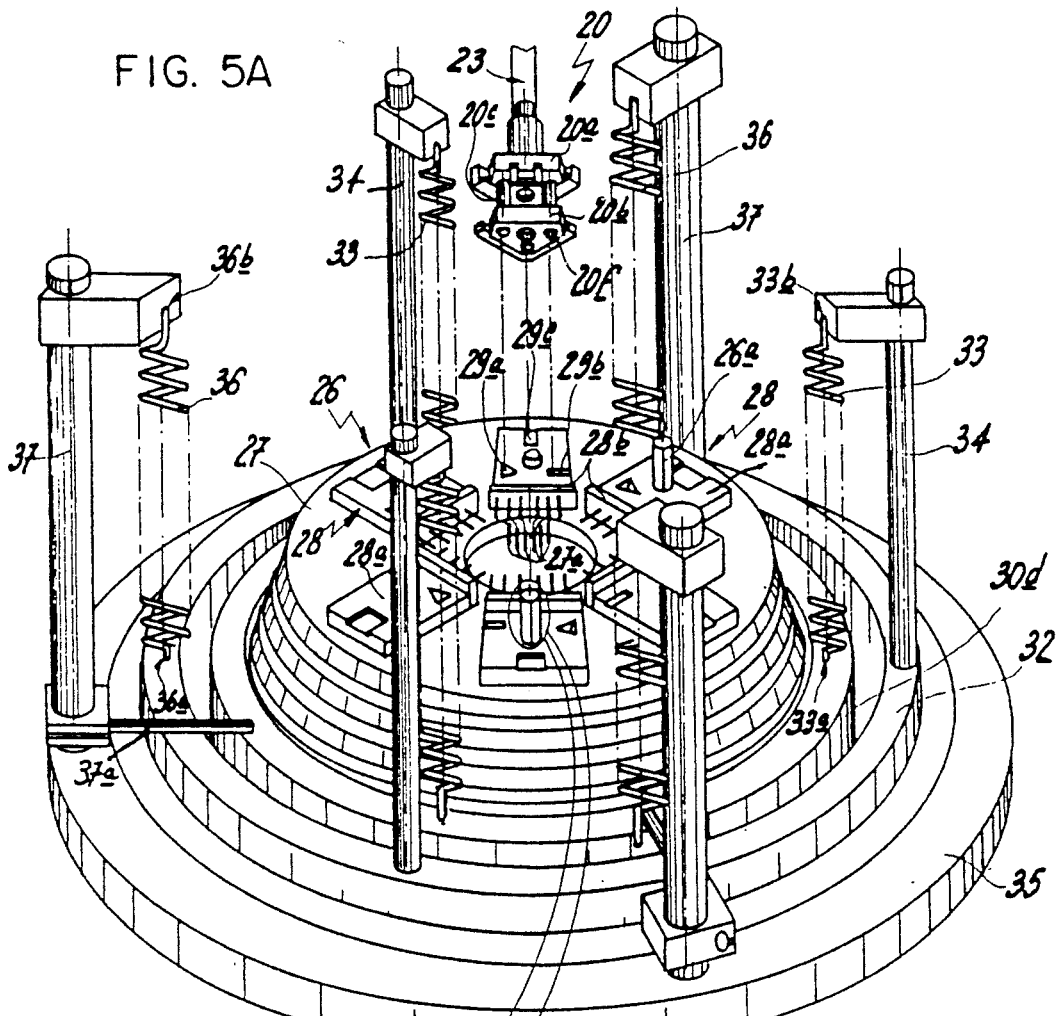
Figure 5B:
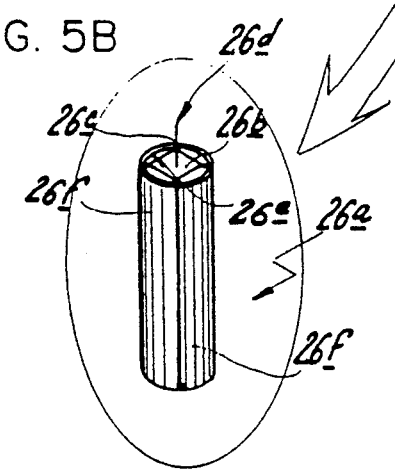

First of all is described in reference to FIGS. 5a and 5b, the forming of an STM device 26. This device includes a cylindrical piezoelectric tube 26a at the top of which is placed a square part 26b, stuck by its four corners and crossed in its center by a small vertical tube 26c of a truncated hypodermic needle type; inside this small tube 26c there is a flat irridiated platinum wire, of tungsten or molybdenum, at the end of which is previously realized a tip 26d acting as microprobe for the STM microscopy. The diameter of this wire is slightly smaller than the inside diameter of the small vertical tube 26c, so that the wire can be preformed to hold by elasticity inside the tube 26c, (as a typical example the diameter of the wire is 0.250 mm for an internal diameter of the small tube 26c of 0.33 mm). In addition, the piezoelectric tube 26a is a ceramic tube, manufactured in a material of the PZT Type (5H) with a low thermal expansion. It presents a continuous electrode 26e, covering its internal surface and an external electrode split longitudinally into four small electrodes 26f, in such a way that, by the application of a voltage between the inside electrode 26e and the outside electrodes 26f, the piezoelectric tube 26a can be stretched out, causing the vertical displacement of the tip 26c while, by applying a voltage between two opposite electrodes 26f, the piezoelectric tube 26a bends perpendicularly to its axis causing the lateral displacement of the tip 26d. It should be noted that, under these conditions, the vertical and lateral resolutions of the displacements of the tip 26d are respectively equal to 0.05 angstroem and 0.1 angstroem.

In addition, each piezoelectric tube 26a is normally placed vertically on a base plate 28 which is fixed on the plate 27. This baseplate 28 includes a square part 28a in the center of which is placed the piezoelectric tube 26a, and an edge 28b spreading over the innermost side of the square part 28a. Six horizontal electric connectors cross through the edge 28b to bring six wires towards the center of the support plate 27; five of these six wires are used to control the five electrodes 26e and 26f of the piezoelectric tube 26a, the sixth wire being connected to the platinum, tungsten or molybdenum wire at the end of which is realized the tip 26d of the device 26. The electric contacts between wires and electric connectors are realized with a conductive adhesive containing silver. As for the baseplate 28, it is made of a machinable glass-ceramic, non-gettering in a vacuum, such as that known by the name of "Macor", for example. In the center of the plate 27, vertical connectors 27a have been provided, which are linked to the horizontal electric connectors allowing the feed and measurement wires of the piezoelectrique tubes 26a to pass through the center of the plate 27.

Moreover, a trihedral hole 29a, a dihedral groove 29b and a plane 29c are machined on the square part 28a of the baseplate 28 so as to form an insertion called "hole/cut/plane" with three spherical blocks 20f located under the lower triangular plane (20b) of the support system 20 of the sample 5, exactly perpendicular to each of the three vertical columns 20c; the "hole/cut/plane" insertion realizes a complete link at zero degree of free motion giving high accuracy in the positioning of the support system 20 on the base 28. In this way, we can easily understand that the piezoelectric tube 26a is engaged in the circular bore 20e (FIG. 4b) provided for that purpose in the lower triangular plane 20b of the support system 20, the height of the vertical columns 20c being chosen so as to bring the sample 5 close to the tip 26d of the STM device 26. Thus, joined on the plate 27, the piezoelectric tube 26a and the support system 20, equipped with its motor 21 operating the micro-plate 22 bearing a sample 5 in its support frame 17 (FIG. 4b), forms a complete STM unique design microscope the structure of which is very beneficial. Indeed, to the contrary of conventional microscopes, the approach called "coarse" is not carried out directly by a displacement of the tip 26d or its support tube 26a, but by that of the sample 5, the microscopy itself being carried out by the sole very precise displacement of the tip 26d by means of the piezoelectric tube 26a. This spatial separation of the reciprocal approach and fine displacement functions between the surface of the sample 5 and the tip 26d gives a highly reliable control of the working of an STM microscope, contributing towards its ease of maintenance and simplicity of use. Moreover, even in placing several STM devices 26 on the support plate 27, there is no need to equip each of these devices 26 with a piezoelectric motor 21 which is expensive, heavy and bulky. In the same way, the support system 20 of a sample 5 is realized as a sole, removable and manipulatable example, the possible replacement of which does not require an always risky intervention on the most accurate and fragile elements of an STM microscope, i.e., the device 26 with its piezoelectric tube 26a bearing the tip (26d). It is therefore obvious that this arrangement 1 greatly contributes towards its reliability and its maintenance.

It also results from above that the accuracy required in the positioning and the relative displacements of the tip 26d and the sample 5 placed on its support system 20 require that the support plate 27 be perfectly isolated from external vibrations. In this respect, in accordance with a supplementary characteristic of the installation 1 described in reference to FIG. 6, the plate 27 is mounted on a set of three rings 30a, 30b and 30c placed on top of each other according to successive planes that are parallel to each other, distant from each other by the height of three identical dampers 31 made of a flexible, elastic material, for example a fluoric elastomer of the type known as "Viton". The dampers 31 are arranged at an angle of 120° to each other on a lower ring (30a, 30b, 30c) to support the ring which is immediately above it (27, 30a, 30b respectively), the lowest ring (30c) forming a base for all the other rings (27, 30a, 30b). Preferably, the dampers 31 are cylinders generated by rotation with axes perpendicular to their bearing surface on the rings (30a, 30b, 30c) and are offset by an angle of 60° from one level to the other. The stacking of plates thus realized is known for isolating in a satisfactory way the STM devices 26 from the vibrations that might effect the installation 1, but they are insufficient in very perturbed environments.

That is why, in accordance with an supplamantary characteristic of the invention, the stacking of the support plate 27 and the rings (30a, 30b, 30c) has a tapered form; this arrangement favors the damping of the vibrations in comparison to a stacking in which all the rings would have the same diameter (cylindrical stacking).

Figure 6:
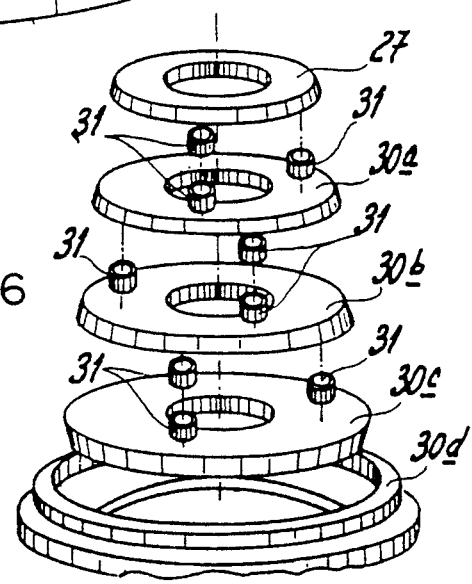

Moreover, according to another characteristic of this invention described in reference to FIGS. 5a and 6, the stacking previously described is equipped with a double suspension system which gives it complementary isolation. For this purpose, the base formed by the ring 30c is fitted into a first external ring 30d, which is held in suspension in relation with a second external ring 32 by means of three identical springs 33 arranged on the periphery of the ring 30d at 120° from each other. Each of these three springs 33 works in elongation between a lower point of attachment 33a taken on the first external ring 30d and a higher point of attachment 33b taken at the top of a vertical column 34, mounted solid on the second external ring 32.

The latter is itself held in suspension in relation to a baseplate 35 forming one piece with the frame of the main enclosure 8 by means of three identical springs 36, arranged on the periphery of the second external ring 32, each of these springs 36 working in elongation between a lower point of attachment 36a taken on the second external ring 32 and a higher point of attachment 36b taken at the top of a vertical column 37 mounted solid with the baseplate 35. In addition, the springs 33 and 36 are offset by 60° in relation to each other and the springs 33 have a rigidity coefficient higher than the rigidity coefficient of the springs 36.

Figure 7:
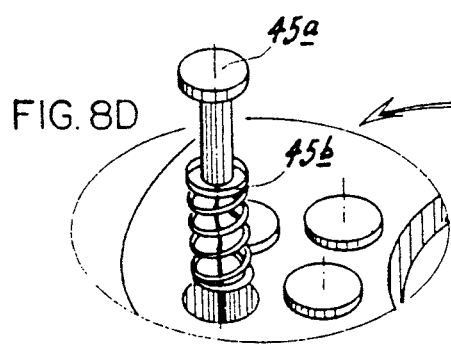
FIG. 7 is a perspective view showing the detail of the stabilization means of the double suspension system of the support plate and its anti-vibration device.

In suspended position, the plate 27 is perfectly isolated from the external vibrations transmitted through the framework of the installation 1 and already partly dampened by the four anti-vibration pneumatic supports 3 (FIG. 1) fitted at the base of the vertical legs 2a of the table 2. In this position, shown in FIG. 5a, we make sure that the external ring 32 and the baseplate 35 widely share the same horizontal plane. In addition, in accordance with FIG. 7, it is possible to accelerate the stabilization of the oscillations occuring when the plate 27 is placed in suspension by providing a set of six magnetized bars 38 horizontally crossing the external ring 32 from one side to the other, placed at 60° to each other, and being, for example, offset by 30° in relation to the springs 33 and 36. These magnetized bars 38 work with a first set of six magnetic masses 39 mounted solid with the baseplate 35 to stabilize the oscillations of the second external ring 32 in relation to the baseplate 35, and with the second set of six magnetic masses 40 mounted solid below the first external ring 30d to stabilize the oscillations of the external ring 30d in relation to the second external ring 32.

It should also be noted that the higher points of attachment 33b of the springs 33 on the vertical columns 34 and the higher points of attachment 36b of the springs 36 on the vertical columns 37 can be lowered or raised which means that the plate 27 can be balanced, taking into account the placing of a support system 20 of a sample 5 on the baseplate 28 of one of the peripheral STM devices 26 of the plate 27 (FIG. 5a).

Figure 8A:
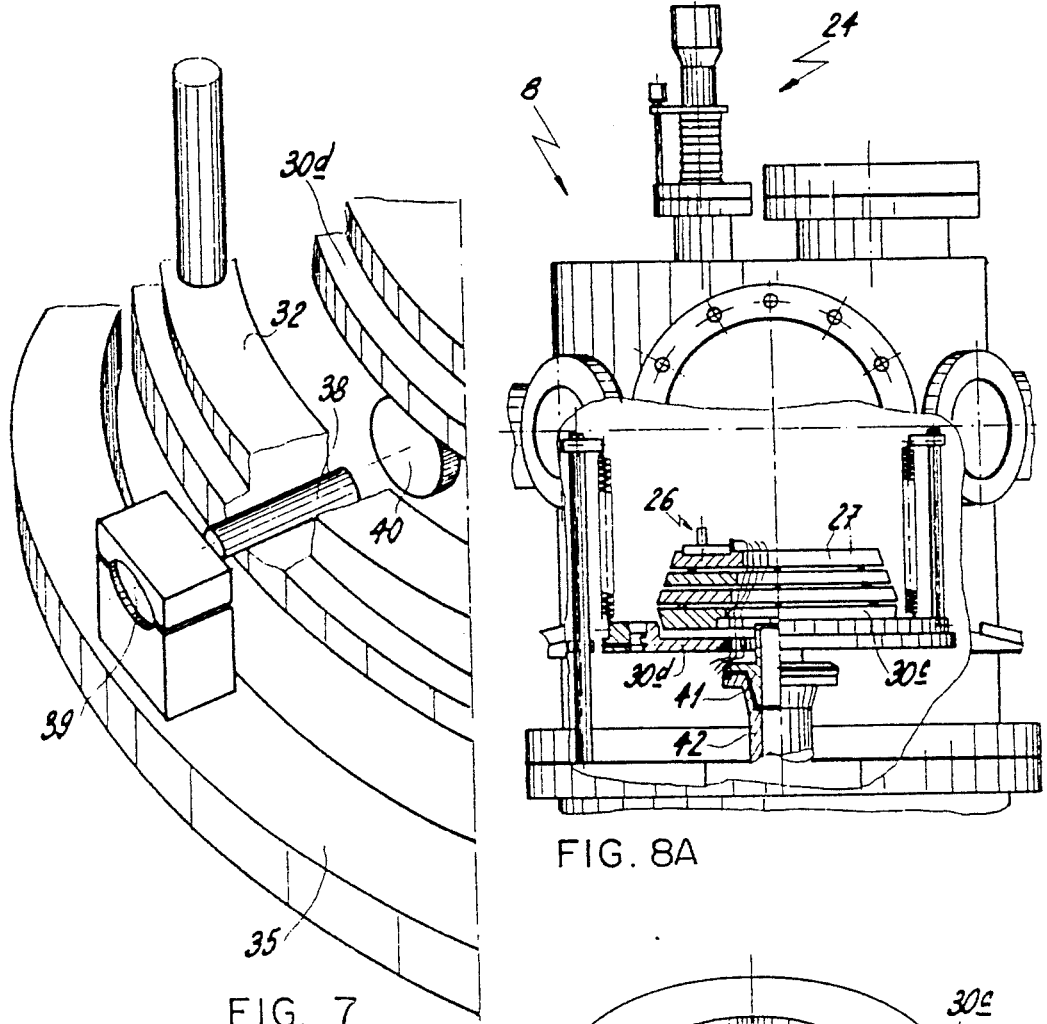
FIG. 8a is a partially exploded view of the main enclosure, showing in particular the device allowing the disconnection and the rotation of the sample support plate from outside the enclosure.
Figure 9:
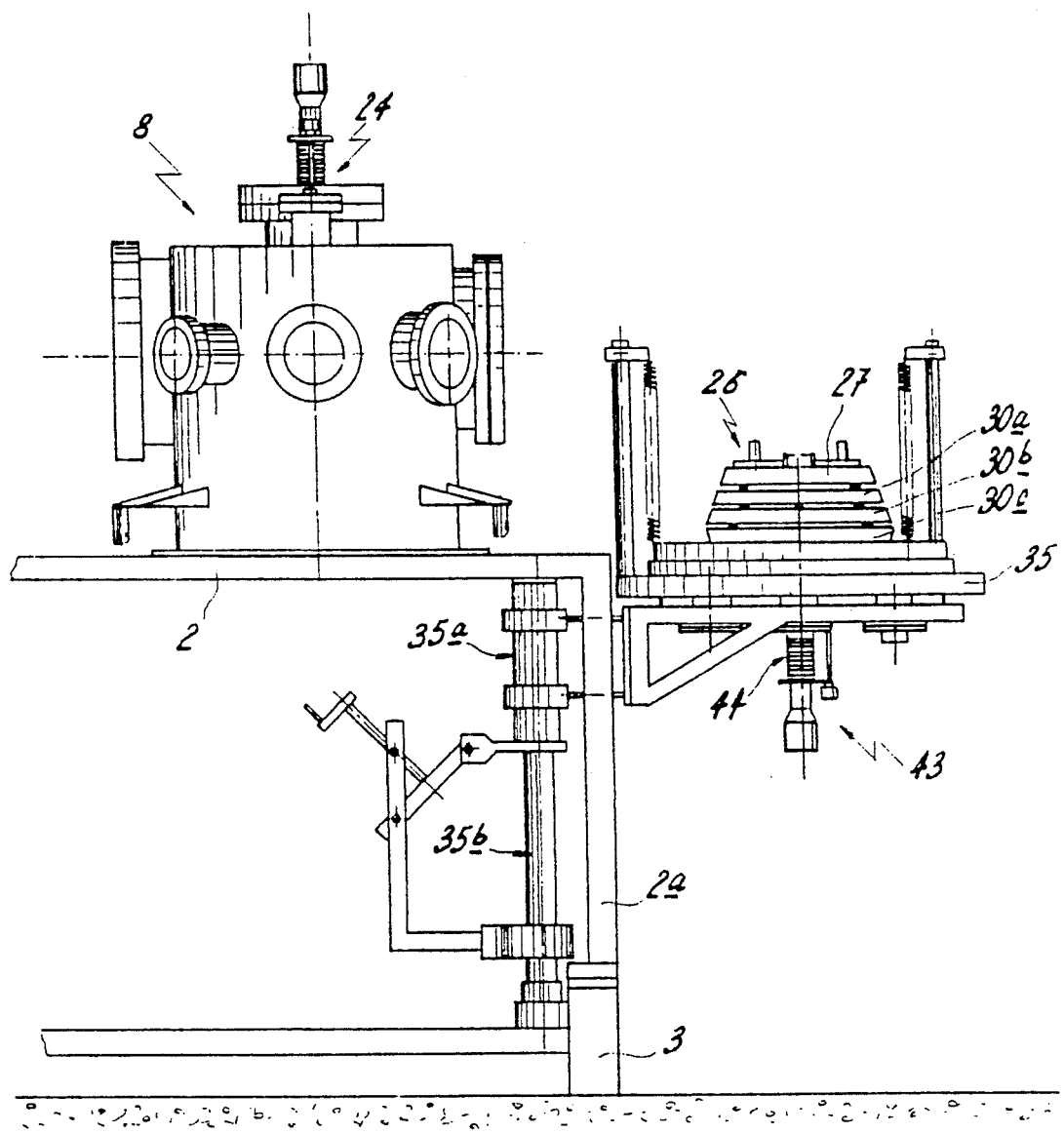
FIG. 9 is a side view of a retracting device of the baseplate carrying the support plate and this baseplate can be lowered and raised at the front of the main enclosure for the maintenance of the elements normally placed within the said enclosure.

According to a main characteristic of this invention, described in reference to FIG. 8a, and to FIG. 9, the plate 27 can be disconnected from the main enclosure 8 and turned on itself around a central axis to allow the use of any one of the devices 26 arranged in its periphery without it being necessary to "break" the high vacuum established in the main enclosure 8.

For this purpose, the base ring 30c is rigidly fixed to a coupling bush 41 crossing in its center the first external ring 30d into which is fitted the base ring 30c. This bush 41 stretches vertically downwards to combine with a hollow cylindrical sleeve 42 which is controlled by a conventional coaxial translation rotation device 43 (FIG. 9), crossing the lower wall of the main enclosure 8 at the level of the bellows type flexible metal joint 44. When the sleeve 42 is lifted to its top position, it fits into the bush 41 which enables to lift the unit composed of the support plate 27, the lower rings 30a, 30b, 30c and the first external ring 30d, thus causing the progressive release of springs 33 and 36 (FIG. 5a). At a height predetermined by three horizontal rods 37a (FIG. 5) held by the vertical columns 37 to act as the top stop for the first external ring 30d, the base ring 30c frees itself from the external ring 30d. At that moment, it becomes possible to rotate the unit composed of the support plate 27 and the lower rings 30a, 30b, 30c, around the vertical axis defined by the bush 41 and the sleeve 42, the plate 27 thus being free in rotation for the positioning of any one of the STM devices 26 in the chosen position of use. The plate 27 can then be brought back to its suspended low position. All these operations are carried out from outside the main enclosure 8 by means of the coaxial translation conventional rotation device 43, the vacuum remaining in the enclosure 8 consequently never being "interrupted" when the plate 27 is manipulated.

Figure 8B:
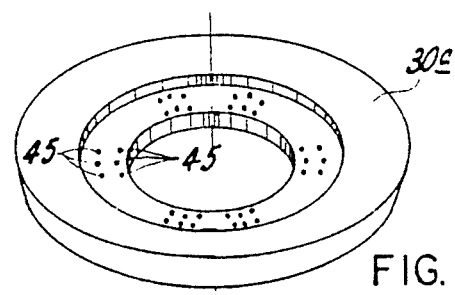
FIGS. 8b, 8c and 8d show the anti-vibration device of the support plate showing the electrical connections necessary for operating the electronic tunneling effect microscopes placed on the plate.
Figures 8C, 8D:
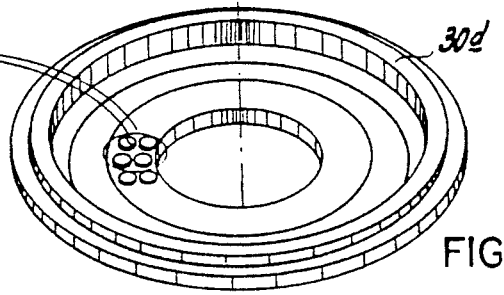

In addition, according to FIGS. 8a, 8b and 8c vertical connectors 45 are provided in the center of the base ring 30c to connect the electrical wires coming from the vertical connectors 27a (FIG. 5a), which are necessary for the working of the piezoelectric tubes 26a and for measuring the tunneling current of the tip 26b. These connectors 45 particular to each of the STM devices 26, normally come into contact with conductive blocks 45a held by little springs 45b placed for that purpose in vertical housings of the first external ring 30d perpendicular to the connectors 45. The blocks 45a are connected downwards to the electrical wires crossing the main enclosure 8 in a conventional way. In this way, when the base ring 30c frees itself from the external ring 30d when the sleeve 42 rises, the contact between the connectors 45 and the conductive blocks 45a is interrupted which enables the base ring 30c to turn freely in relation to the external ring 30d without being hindered by any electrical wire. In low position, the connectors 45 particular to the STM device 26 used come into contact with the blocks 45a by crushing the small springs 45b in their housing which gives a sufficient electrical connection.

According to another characteristic of the installation 1 in compliance with FIG. 9, the baseplate 35 supporting the unit composed of the support plate 27, the lower rings 30a, 30b, 30c, the first external ring 30d and the second external ring 32, can be retracted from the underside of the main enclosure 8. For this purpose, the baseplate 35 is articulated on its periphery around a vertical axis, presenting a sheath 35a mounted so that it slides round a vertical center shaft 35b, the sheath 35a being rigidly solid with the base plate 35. In this way, the base plate 35 can be lowered or raised in relation to the lower level of the closing of the main enclosure 8 and then free the baseplate 35 from below the enclosure 8, so as to be able to operate on the unit previously mentioned (composed of the support plate 27, the lower rings 30a, 30b, 30c, the first external ring 30d and the second external ring 32), preferably at the front of the installation 1. This arrangement of the installation 1 in compliance with the invention, considerably shortens the time of the interventions that are sometimes necessary for the cleaning of the elements normally situated within the main enclosure 8, interventions whose frequency is considerably reduced due to the characteristics of the installation 1 which have been developped in detail in the previous description.

Of course this invention is not limited to the characteristics described or shown in the attached drawings, but includes any installation including or combining technical means equivalent to these characteristics in accordance with the teachings of the invention. In particular, it is within the scope of the man of the trade to adapt the technical solutions adopted for the case more specifically developed here of the use of installation 1 for electronic tunneling effect microscopy in ultravacuum to other applications of the SXM type, i.e., to optical near field microscopy, optical tunneling effect microscopy, to their respective spectroscopy, to the etching of nanometric structures by optical and/or electronic microlithographic processes, or to any other technique using a microprobe placed in the close proximity of the surface of the sample. These various techniques are the object of various applications for patents in France (i.e., patent applications FR-89.11297, FR- 89.12497, FR-89.14425 and FR-89.14289), which can easily be worked in accordance with the teachings of this invention.

We claim:

1. Installation for the analysis or transformation of the surface of samples placed in vacuum or in a controlled atmosphere, including a main enclosure in which is placed a support plate for at least one device, called SXM, in which a microprobe such as a light or electricity conducting tip is positioned close to the surface of the sample to be examined, whether in the air or in a vacuum, the at least one device being intended for the microscopy, spectroscopy or etching of the sample surface by scanning of the surface by the microprobe, said support plate being equipped with means for disconnecting said support plate from the main enclosure and with means for rotating said support plate around a central axis allowing the use of a series of SXM devices fitted into the periphery of said support plate, the main enclosure is completed by a scrubbing enclosure for the surface of the samples and by an introduction and storage enclosure of said samples, which can be handled through the installation by the end of a conveyor rod that can be moved longitudinally and in axial rotation along an alignment axis of said introduction and storage, scrubbing and main enclosures.

2. Installation in accordance with claim 1, characterized in that the samples are mounted on a support frame in which the samples are held by a counter-frame, at least one threaded hole is provided on the side of said frame so that an end of a threaded shaft can be screwed into coaxial sleeve of the conveyor rod, the longitudinal movements of the conveyor rod being obtained by means of a rack and pinon device working with said shaft.

3. Installation in accordance with claim 1 characterized in that a storage device of the samples to be analyzed or etched is placed in the introduction and storage enclosure, said storage device being in the form of a rack with compartments to receive the support frames of the samples, said rack being held in an upper part by a vertical rod crossing an upper wall of said introduction and storage enclosure at the level of a flexible, bellows metal coupling said vertical rod being controlled by a coaxial translation rotation device used for the vertical translation and vertical pivoting of said storage device.

4. Installation in accordance with claim 3, characterized in that a heating element is provided above the highest horizontal tray of the rack and allows gettering of a sample previously placed with its support frame on said rack.

5. Installation in accordance with claim 1, characterized in that a support system of the samples is placed within the main enclosure, said support system being borne by a handling arm crossing an upper wall of the main enclosure at the level of a flexible, bellows metal coupling, said arm being controlled by a coaxial translation rotation device used for the vertical translation and vertical pivoting of said support system.

6. Installation in accordance with claim 5, characterized in that the support system is equipped with piezoelectric means for vertical displacement capable of vertically moving a substantially horizontal microplate adapted for receiving a sample.

7. Installation in accordance with claim 6, characterized in that the support system has two superimposed planes connected by three vertical columns, said two superimposed planes comprising an upper triangular plane and a lower triangular plane, each of said vertical columns being placed between a top of the upper triangular plane and a top of the lower triangular plane, vertical columns being placed between a top of the upper triangular plane and a top of the lower triangular plane, said superimposed planes being respectively equipped with an upper circular borehole and a lower circular borehole, the upper circular borehole being made to receive a piezoelectric motor, so that the sample placed on the microplate can be brought close to a tip of an STM device resting on the support plate, by engagement of said STM device in said lower circular borehole.

8. Installation in accordance with claim 7, characterized in that each STM device is placed on a baseplate fixed on the support plate, a trihydral shaped hole, a dehydral shaped groove and a plane being machined in the baseplate to form an insertion called "hole/cut/plane": with three spherical blocks located under the lower triangular plane of the support system of the sample, perpendicular to each of the three vertical columns.

9. Installation in accordance with claim 8, characterized in that the baseplate includes a square part in the center of which rests the STM device and an edge stretching on an innermost side of said square part to receive horizontal electrical connectors bringing electrical supply and measurement wires from said STM device towards vertical connectors provided in the center the support plate.

10. Installation in accordance with claim 5, comprising a piezoelectric motor including an external cylinder inside of which can be displaced an internal cylinder bearing by a base a microplate, the microplate being able to hold the support frame of a sample by fitting in a set of spring leaves.

11. Installation in accordance with claim 1, characterized in that the support frame can be retracted under the main enclosure.

12. Installation in accordance with claim 1, characterized in that the support plate rests on a set of rings superimposed on each other following successive planes parallel between each other distant from each other by the height of three identical dampers made of a flexible elastic material placed at an angle of 120° to each other on a lower ring to bear the ring immediately above, a lowest ring of said set of rings forming a base for all the other rings, the base formed by the lowest ring also being fitted into a first external ring which is held in suspension in relation to a second external ring outside the first external ring by means of three first identical springs arranged on the periphery of the first external ring at 120° to each other, each of these three springs working in elongation between a lower point of attachment taken on the first external ring and a higher point of attachment taken at the top of a first vertical column solid with the second external ring, said second external ring being held in suspension in relation to a baseplate solid with the frame of the main enclosure by means of three identical second springs arranged on the periphery of said second external ring, each of said three second springs working in elongation between a lower point of attachment taken on the second external ring and a higher point of attachment taken at the top of a second vertical column solid with said baseplate, said first springs having a rigidity coefficient higher than the rigidity coefficient of said second springs.

13. Installation in accordance with claim 12, characterized in that the stacking of the support plate and the lower rings has a tapered shape.

14. Installation in accordance with claim 12, characterized in that magnetized bars horizontally cross from one side to the other the second external ring to combine with a first set of magnetic masses mounted solid with the baseplate for the stabilization of the oscillations of said second external ring in relation to said baseplate, and with a second set of magnetic masses mounted solid beneath the first external ring for the stabilization of the oscillations of said first external ring in relation to said second external ring.

15. Installation in accordance with claim 12, characterized in that the baseplate bearing a unit composed of the support plate, the lower rings, the first external ring and the second external ring is articulated on its periphery around a vertical axis presenting a sheath sliding around a vertical central shaft, said sheath being rigidly solid with said baseplate in such a way that said unit can be retracted under the main enclosure so as to be able to act on at least one of the plate and the SXM devices of the STM device intended for electronic tunneling effect microscopy, preferably at the front of the installation.

16. Installation in accordance with claim 12, characterized in that the base ring is rigidly fixed to a coupling bush crossing in its center the first external ring in which is fitted said base ring, said bush stretching vertically downwards to combine with a hollow cylindrical sleeve crossing a lower wall of the main enclosure at the level of a flexible, bellows metal coupling, said sleeve being controlled by a coaxial translation rotation device used for lifting the unit composed of the support plate, the lower rings and the first external ring causing the gradual release of the two sets of first and second springs, until said base ring becomes free from said external ring and can rotate freely.

17. Installation in accordance with claim 16, characterized in that three horizontal rods are held by the vertical columns to act as high stop to the first external ring, the base ring becoming free from said external ring at a height predetermined by the height of horizontal rods along said vertical columns.

18. Installation in accordance with claim 16, characterized in that vertical connectors are provided in the center of the base ring to connect electrical wires coming from vertical connectors provided at the center of the support plate, said vertical connectors being particular to each of the SXM devices of the STM device intended for electronic tunneling effect microscopy coming normally into contact with conductive blocks held by small springs placed for this purpose in vertical housings of the first external ring perpendicular to the connectors, the connectors prolongating the conductive blocks towards electric wires crossing the main enclosure.

* * * * *

UNITED STATES PATENT AND TRADEMARK OFFICE
CERTIFICATE OF CORRECTION

PATENT NO. : 5,306,918  
DATED : May 7, 1991  
INVENTOR(S) : Jean-Pierre GOUDONNET et al.

It is certified that error appears in the above-indentified patent and that said Letters Patent is hereby corrected as shown below:

At column 1, line 59 of the printed patent, change "car" to ---can---.

At column 7, line 42 of the printed patent, after "on", insert ---horizontal trays 16B of the rack 16A where they are held securely by a set of two spring leaves 16c. In addition, a heating element 16d is provided above the highest horizontal tray 16b and allows, if necessary, to getter a sample 5 previously placed with its support frame 17 on the tray 16b.

In accordance with Fig. 3a, the rack 16a is held at its upper part above the heating element 16d by a vertical rod 16e crossing the upper wall of the enclosure 4 at the level of a flexible metal coupling 18 of the bellows type, the rod 16e being held at the top by a "coaxial translation conventional rotation device" 19 used for the vertical translation and vertical pivoting of the storage device 16. During the vertical manipulation of the rack 16a, the bellows type flexible metal coupling 18 is flattened or stretched under the effect of the movement of a horizontal slide 19a along a vertical axis 19b, possibly divided into degrees for an easy position finding of the height of the rack 16a. A micrometric screw 19c, solid with the top of the vertical axis 19b, allows the slide 19a to be moved vertically. This movement results from the transformation of the rotation movement of the screw

UNITED STATES PATENT AND TRADEMARK OFFICE
CERTIFICATE OF CORRECTION

PATENT NO. : 5,306,918
DATED : May 7, 1991
INVENTOR(S) : Jean-Pierre GOUDONNET et al.

It is certified that error appears in the above-indentified patent and that said Letters Patent is hereby corrected as shown below:

19c into a translation movement of the slide 19a by means of a classical worm screw, not shown in the Figures, or by any other equivalent means. Furthermore, a vernier 19d is fixed to the top of the rod 16e of the rack 16a in such a way that the rotation of the storage device 16 can be controlled.

To recover a sample 5 resting with its support frame 17 on a horizontal tray 16b, the tray 16b is brought up to the level of the medium plane of the enclosures (4, 6, 8) in which is also to be found the end 15d of the shaft 15b of the conveyor rod 15. The vernier 19d may, if required, allow the rack 16a to be turned on itself so as to bring the threaded hole 17b of the support frame 17 perpendicular to the end 15d so that the conveyor rod 15 can be screwed onto the frame 17 after having brought it forward itself by means of the rack and pinion device 15a (Fig. 2); the withdrawal of the conveyor rod 15 then frees the support frame 17, supporting the sample 5 from the interval included between two spring leaves 16c provided on the upper part of the horizontal tray 16b. The rack 16a is then raised above the medium plane of the enclosures (4, 6, 8), thus clearing the longitudinal path of the conveyor rod 15. The sample 5 can---.

At column 14, lines 4, 5 and 6 (claim 7, lines 7, 8 and 9) of the printed patent, delete "vertical columns

UNITED STATES PATENT AND TRADEMARK OFFICE
CERTIFICATE OF CORRECTION

PATENT NO.  : 5,306,918
DATED       : May 7, 1991
INVENTOR(S) : Jean-Pierre GOUDONNET et al.

It is certified that error appears in the above-indentified patent and that said Letters Patent is hereby corrected as shown below:

```
being placed between a top of the upper triangular plane and a top
of the lower triangular plane".
```

Signed and Sealed this

Eleventh Day of June, 1996

BRUCE LEHMAN

*Attest:*

*Attesting Officer*    Commissioner of Patents and Trademarks